(12) United States Patent
Liu et al.

(10) Patent No.: US 7,847,471 B2
(45) Date of Patent: Dec. 7, 2010

(54) LED LAMP

(75) Inventors: Tay-Jian Liu, Taipei Hsien (TW);
Jian-Bing Qian, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/541,180

(22) Filed: Aug. 14, 2009

(65) Prior Publication Data
US 2010/0264800 A1 Oct. 21, 2010

(30) Foreign Application Priority Data
Apr. 16, 2009 (CN) .......................... 2009 1 0301597

(51) Int. Cl.
*H01K 1/58* (2006.01)
(52) U.S. Cl. .......................... 313/46; 313/512
(58) Field of Classification Search ................ 313/11, 313/42, 46, 110, 512
See application file for complete search history.

(56) References Cited

U.S. PATENT DOCUMENTS

2006/0091772 A1* 5/2006 Li .............................. 313/46

* cited by examiner

*Primary Examiner*—Joseph L Williams
*Assistant Examiner*—Brenitra M Lee
(74) *Attorney, Agent, or Firm*—Frank R. Niranjan (57) ABSTRACT

An LED lamp includes a hollow lamp housing, a front optical part, a rear electrical part, and a middle heat dissipation part. The heat dissipation part includes a heat sink, a mounting seat in front of the heat sink, and a heat conducting member connecting the mounting seat with the heat sink. The lamp housing defines a plurality of air exchanging holes corresponding to the fins. The mounting seat includes a small top surface, an opposite large bottom surface, and a plurality of sloping heat absorbing surfaces between the top surface and the bottom surface. The optical part includes a plurality of light sources arranged on the heat absorbing surfaces, a light reflector located between the heat sink and the mounting seat and surrounding the heat conducting member, an optical lens located in front of the light reflector and the mounting seat.

17 Claims, 11 Drawing Sheets

LED LAMP

BACKGROUND

1. Technical Field

The present disclosure relates to an LED (light emitting diode) lamp, and particularly to an LED lamp with a high heat dissipating efficiency and an even illumination intensity.

2. Description of Related Art

In recent years, LEDs are preferred for use in LED lamps rather than CCFLs (cold cathode fluorescent lamps) and other traditional lamps due to their excellent properties, including high brightness, long lifespan, directivity, and etc.

For an LED, about eighty percents of the power consumed thereby is converted into heat. Therefore, a heat dissipation device is necessary for timely and adequately removing the heat generated by the LED. Generally, the LED lamp includes a plurality of LEDs. The LEDs are arranged on a flat surface whereby an illumination area of the LEDs is limited. Thus, the illumination device cannot obtain a desired illumination area.

Further, the light emitted by the LEDs is not evenly distributed due to the directive reflection property of the LEDs. Further, high beam of the LEDs has blinding effect. Direct glare coming straight from the LEDs causes discomfort and annoyance.

For the foregoing reasons, therefore, there is a need in the art for an LED lamp which overcomes the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Reference will now be made to the drawing figures to describe the various embodiments in detail.

Figure 1:
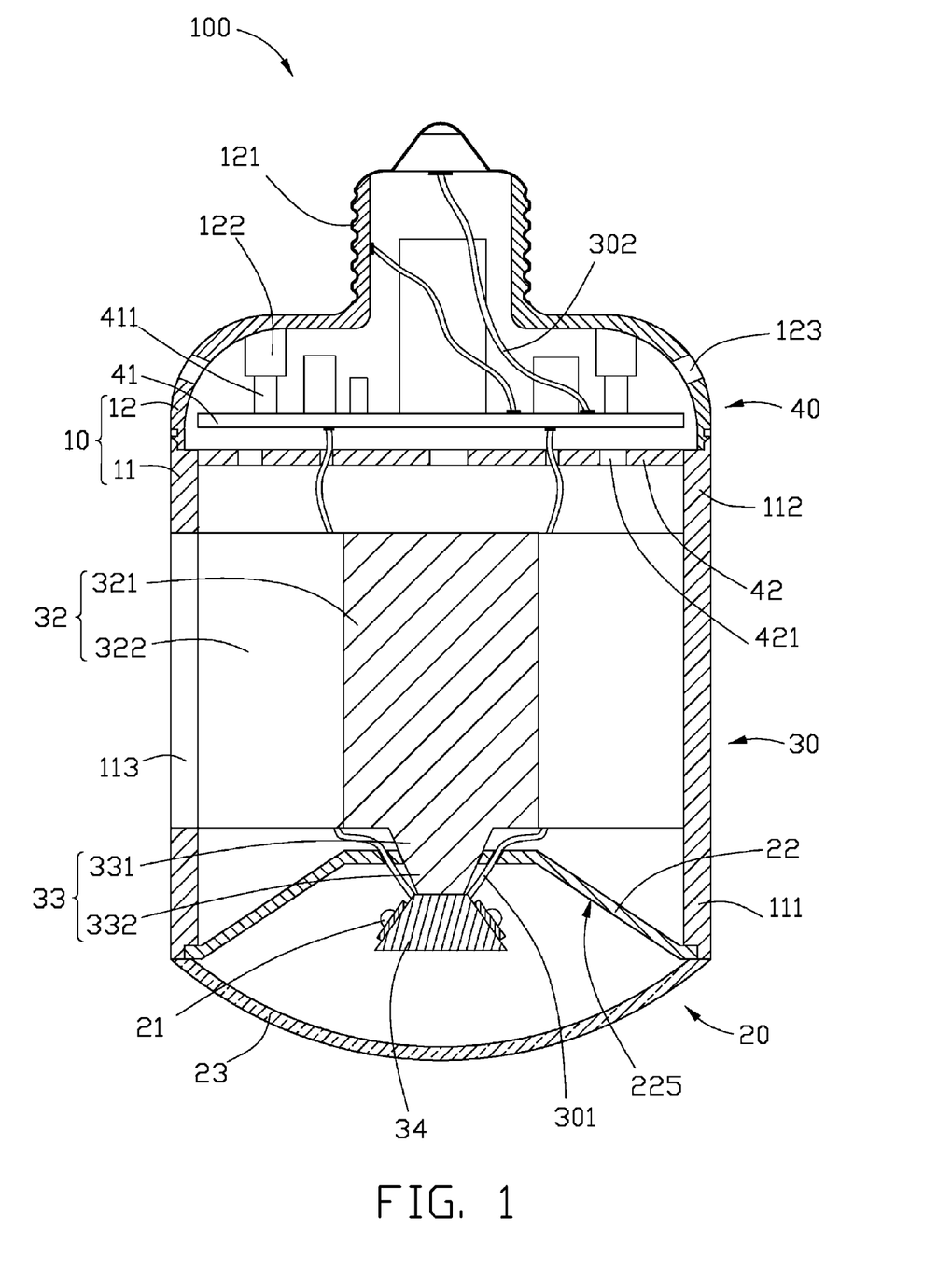
FIG. 1 is a cross-sectional view of an LED lamp in accordance with a first embodiment.

Referring to FIG. 1, an LED lamp 100 according to a first embodiment includes a hollow lamp housing 10, an optical part 20, a heat dissipation part 30, and an electrical part 40. The LED lamp 100 is substantially cylindrical. The optical part 20 is arranged at a front end of the LED lamp 100. The electrical part 40 is arranged at a rear end of the LED lamp 100. The heat dissipation part 30 is located between the optical part 20 and the electrical part 40. The optical part 20, the heat dissipation part 30 and the electrical part 40 are received in the lamp housing 10.

The lamp housing 10 includes a front shell 11 and a rear shell 12 connected to the front shell 11. The front shell 11 is a hollow cylinder, and has a front end 111 and an opposite rear end 112 connecting with the rear shell 12. The optical part 20 is arranged at the front end 111 of the front shell 11. The heat dissipation part 30 is arranged in the front shell 11, while the electrical part 40 is arranged in the rear shell 12. The rear shell 12 is cup-shaped. The rear shell 12 has an open front end connected with the rear end 112 of the front shell 11, and a rear screw base 121 for electrically connecting with a power socket.

The heat dissipation part 30 is provided with a heat sink 32, a heat conducting member 33 and a mounting seat 34. The heat sink 32, the heat conducting member 33 and the mounting seat 34 are arranged in the front shell 11.

The heat sink 32 is made of a material having a high heat conductivity, such as aluminum or aluminum alloy. The heat sink 32 includes a column-shaped solid base 321 and a plurality of fins 322 extending radially and outwardly from a circumferential surface of the solid base 321. The front shell 11 defines a plurality of air exchanging holes 113 therein corresponding to the fins 322 of the heat sink 32, to thereby allow an ambient airflow to flow into and out of the front shell 11. The air exchanging holes 113 are longitudinally extended in a circumferential surface of the front shell 11 and defined radially through the circumferential surface of the front shell 11.

The heat conducting member 33 is solid, and made of a material having a high heat conductivity. The heat conducting member 33 is located at a front side of the heat sink 32, and has a rear large end 331 connected to the solid base 321 of the heat sink 32 and a front small end 332 connected to the mounting seat 34. A cross-sectional area of the heat conducting member 33 is gradually decreased from the large end 331 towards the small end 332 of the heat conducting member 33. The large end 331 of the heat conducting member 33 is connected to a front end surface of the solid base 321 of the heat sink 32 adjacent to the optical part 20. In this embodiment, the heat conducting member 33 and the heat sink 32 are integrally formed as a monolithic piece so as to reduce a thermal resistance between the heat conducting member 33 and the solid base 321 of the heat sink 32. Alternatively, the heat conducting member 33 and the heat sink 32 can be separately made, and then the heat conducting member 33 is mounted to the solid base 321 of the heat sink 32 by soldering or via fixing members such as screws. In this instance, the heat conducting member 33 can be made of a material having a higher heat conductivity than the material forming the heat sink 32. For example, the heat conducting member 33 may be made of copper or copper alloy.

The mounting seat 34 is located in front of the heat sink 32 and connected to the small end 332 of the heat conducting member 33. The heat conducting member 33 thermally connects the mounting seat 34 with the solid base 321 of the heat sink 32. The mounting seat 34 is made of a material having a high heat conductivity, such as copper or copper alloy, and has a configuration of a frustum of a pyramid.

Figure 2:
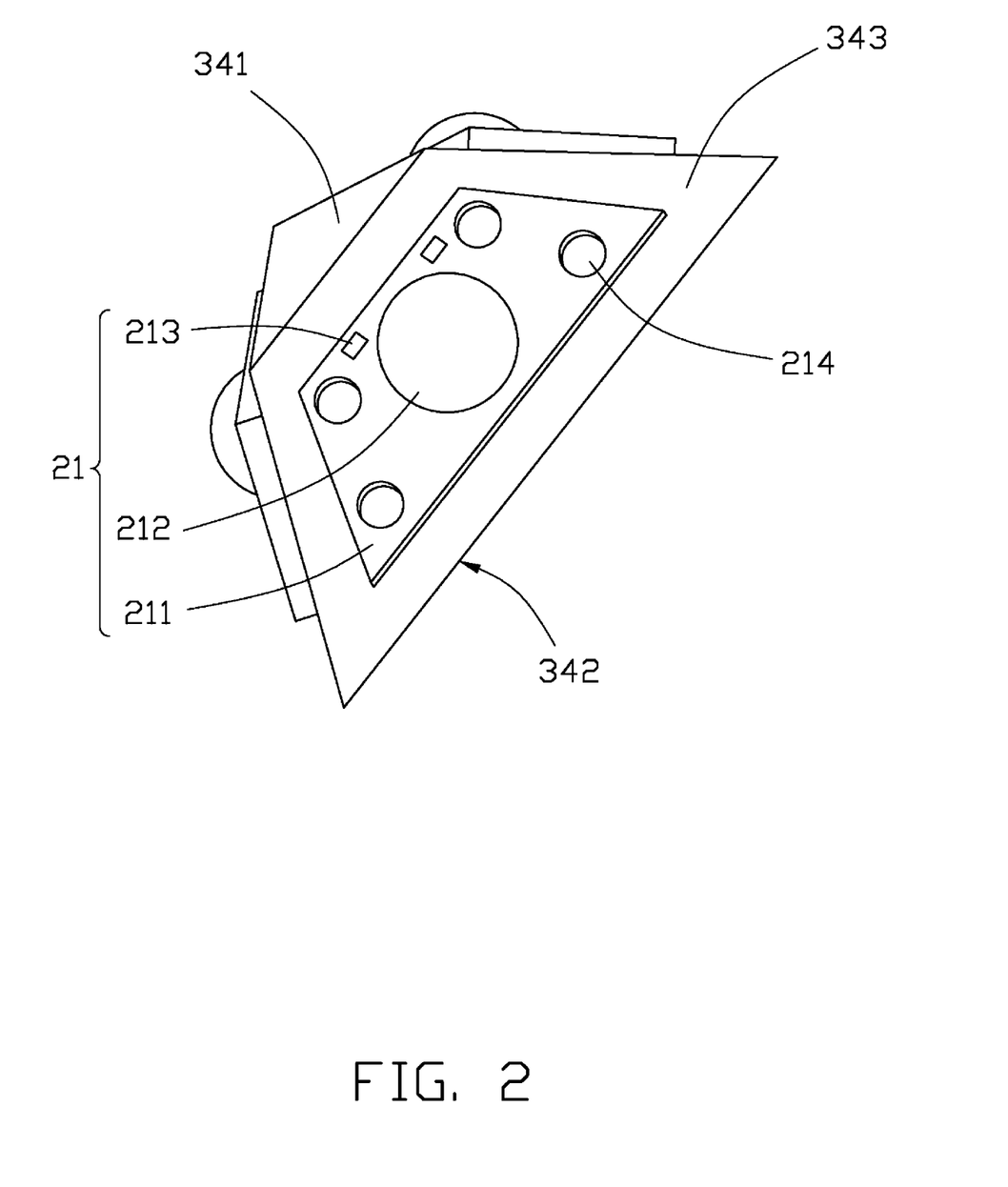
FIG. 2 is an assembled, isometric view of a plurality of light sources and a mounting seat of the LED lamp of FIG. 1.

Referring also to FIG. 2, in this embodiment, the mounting seat 34 is in the form of a frustum of a triangular pyramid. The mounting seat 34 includes a triangular top surface 341 facing the heat sink 32, an opposite triangular bottom surface 342 parallel to the top surface 341, and three sloping heat absorbing surfaces 343 between the top surface 341 and the bottom surface 342. Each heat absorbing surface 343 extends from the bottom surface 342 to the top surface 341 and converges towards a center of the top surface 341. A cross-sectional area of the mounting seat 34 is gradually decreased from the bottom surface 342 towards the top surface 341 of the mounting seat 34. The top surface 341 of the mounting seat 34 is connected to the small end 332 of the heat conducting member 33, with the sloping heat absorbing surfaces 343 of the mounting seat 34 face the heat sink 32. The small end 332 of the heat conducting member 33 has a size substantially equal to the top surface 341 of the mounting seat 34 so as to quickly and effectively transfer heat from the mounting seat 34 to the heat conducting member 33. The mounting seat 34 and the heat conducting member 33 are separately made to simplify the manufacturing process. Alternatively, the mounting seat 34 and the heat conducting member 33 can be integrally formed as a monolithic piece so as to reduce a thermal resistance therebetween.

The optical part 20 is arranged in front of the heat dissipation part 30. The optical part 20 includes a plurality of light sources 21 mounted on the heat absorbing surfaces 343 of the mounting seat 34, a light reflector 22 and an optical lens 23. Each of the light sources 21 includes a substrate 211, a plurality of electrodes 213 formed on substrate 211, and at least one LED 212 (light emitting diode) arranged on and electrically connected to the electrodes 213 of the substrate 211. The light sources 21 are respectively mounted on the heat absorbing surfaces 343 of the mounting seat 34, to thereby obtain a three-dimensional illumination. The light sources 21, the mounting seat 34, the heat conducting member 33 and the heat sink 32 cooperatively form a light engine for the LED lamp 100.

A plurality of through holes 214 are defined in the substrate 211 of each light source 21 and located adjacent to a peripheral edge of the substrate 211. Fixing devices, such as screws, extend through the through holes 214 of the substrate 211 of each light source 21 and threadedly engage into a corresponding heat absorbing surface 343 of the mounting seat 34, to thereby securely attach the light source 21 to the corresponding heat absorbing surface 343 of the mounting seat 34.

When the light sources 21 are mounted to the heat absorbing surfaces 343 of the mounting seat 34, a layer of thermal interface material (TIM) may be applied between the substrate 211 of each light source 21 and a corresponding heat absorbing surface 343 of the mounting seat 34 to eliminate an air interstice therebetween, to thereby enhance a heat conduction efficiency between the light source 21 and mounting seat 34. Alternatively, the substrate 211 of each light source 21 can be attached to the corresponding heat absorbing surface 343 of the mounting seat 34 fixedly and intimately through surface mount technology (SMT).

Figure 3:
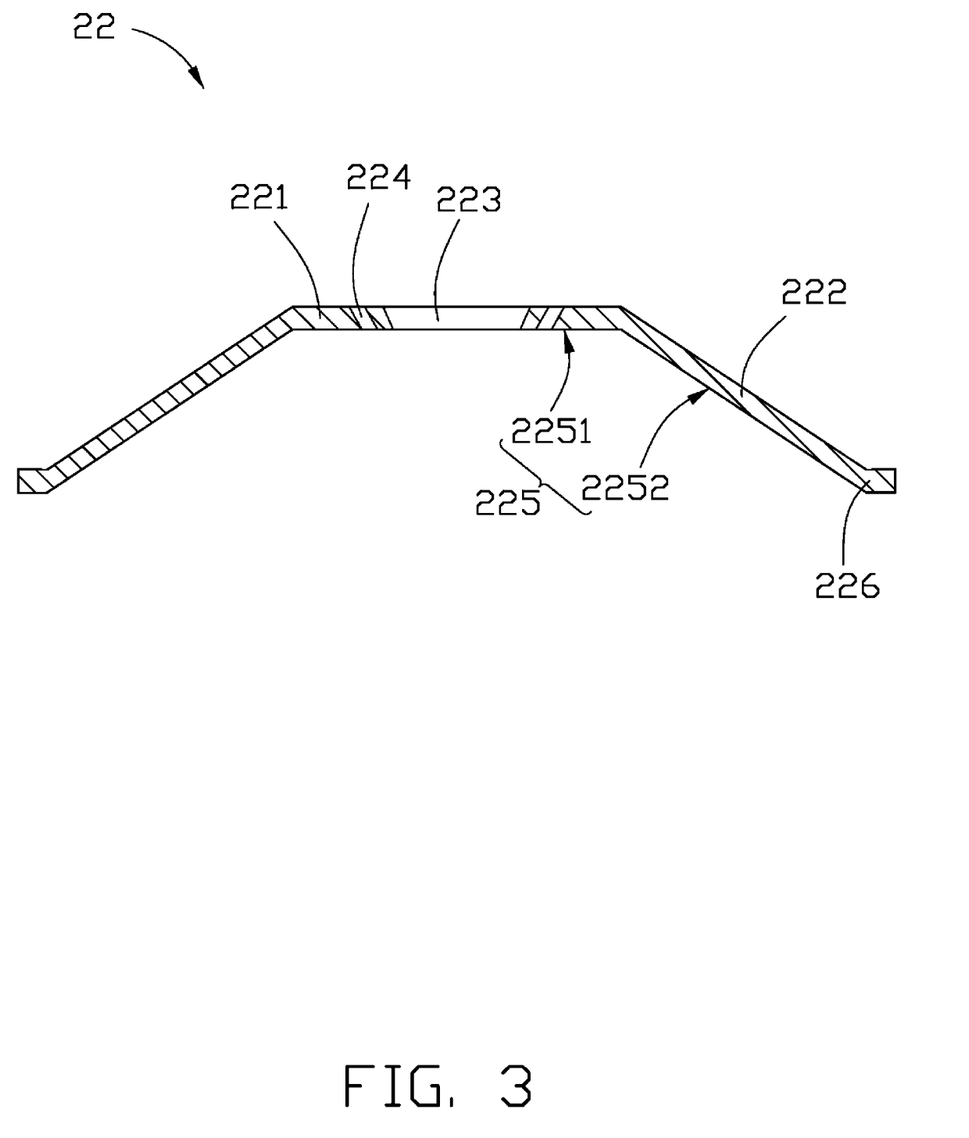
FIG. 3 is an enlarged view of a light reflector of the LED lamp of FIG. 1

The light reflector 22 is located between the heat sink 32 and the mounting seat 34, and surrounds the heat conducting member 33. Referring also to FIG. 3, the light reflector 22 has a configuration of a dish, and a size of the light reflector 22 tapers along a direction from the front end 111 towards the rear end 112 of the front shell 11. The light reflector 22 includes a planar mounting portion 221 and a tapered reflecting portion 222 extending forwardly and outwardly from an outer peripheral edge of the mounting portion 221. The mounting portion 221 defines a positioning hole 223 therein for the heat conducting member 33 extending therethrough. A plurality of wire holes 224 are defined in the mounting portion 221 of the light reflector 22 and located around the positioning hole 223. When the mounting seat 34 and the heat conducting member 33 are integrally formed as a monolithic piece, the light reflector 22 can be formed by two separate semi-circular reflectors which are then assembled together.

The light reflector 22 forms a light reflecting surface 225 at a front side thereof facing the light sources 21. The light reflecting surface 225 of the light reflector 22 surrounds the light sources 21. A shape of the light reflecting surface 225 is designed to meet an arrangement of the light sources 21 mounted on the mounting seat 34, to thereby make the light reflecting surface 225 of the light reflector 22 face all of the light emitting directions of the light sources 21. Thus, light emitted by the light sources 21 can be evenly reflected and guided by the light reflector 22 to the optical lens 23. In this embodiment, the light reflecting surface 225 of the light reflector 22 includes an annular planar surface 2251 formed on an inner side of the mounting portion 221 and a tapered surface 2252 formed on an inner side of the reflecting portion 222. The tapered surface 2252 gradually expands outwardly from the outer peripheral edge of the mounting portion 221 to a front free end 226 of the reflecting portion 222 located adjacent to the optical lens 23. When the light reflector 22 is mounted in the front shell 11, the front free end 226 of the reflecting portion 222 of the light reflector 22 abuts the front end 111 of the front shell 11.

The optical lens 23 is located in front of the light reflector 22 and mounted to the front end 111 of the front shell 11. The light reflector 22 and the optical lens 23 cooperatively receive the mounting seat 34 and the light sources 21 therein. The optical lens 23 can form a plurality of spherical protrusions thereon to expand the illumination area of the LED lamp 100 and reduce glare from the light reflected by the light reflector 22.

The electrical part 40 provides drive power, control circuit and power management for the light sources 21. The electrical part 40 includes a circuit board 41 received in an inner space of the rear shell 12. The circuit board 41 electrically connects with the electrodes 213 of the light sources 21 via a plurality of electrical wires 301 and electrically connects with the screw base 121 via a plurality of electrical wires 302, whereby the LED lamp 100 can get power from an external power source via the power socket (not shown) connected to the screw base 121. The circuit board 41 is mounted in the rear shell 12 via a plurality of sockets 122 and a plurality of connecting poles 411.

The sockets 122 are attached to an inner surface of the rear shell 12. The connecting poles 411 connect the circuit board 41 with the sockets 122. The heat dissipation part 30 further includes a partition plate 42 arranged between the circuit board 41 and the heat sink 32. The partition plate 42 is mounted to the rear end 112 of the front shell 11 and defines therein a plurality of air openings 421 which communicate the heat dissipation part 30 with the electrical part 40. A plurality of air apertures 123 are defined radially through the rear shell 12 at a position adjacent to the screw base 121. The air apertures 123 communicate the inner space of the rear shell 12 with an outside environment, and are utilized for dissipating heat generated by the circuit board 41. The electrical wires 301 extend through the partition plate 42 and the wire holes 224 of the light reflector 22 to electrically connect the light sources 21 with the circuit board 41.

In operation, heat generated by the LEDs 212 of the light sources 21 is absorbed by the mounting seat 34. The heat absorbed by the mounting seat 34 is rapidly transferred to the solid base 321 and the fins 322 of the heat sink 32 via the heat conducting member 33. Air in passages defined between adjacent fins 322 of the heat sink 32 is heated by the heat transferred to the fins 322 and the solid base 321, and then floats upwardly. One portion of the heated, upwardly floating air escapes to the ambient atmosphere via the air exchanging holes 113 of the front shell 11. The other portion of the heated, upwardly floating air enters into the rear shell 12 via the air openings 421 of the partition plate 42, and then escapes to the ambient atmosphere via the air apertures 123 of the rear shell 12. Cooling air in the ambient atmosphere enters into the front shell 11 via the air exchanging holes 113 of the front shell 11, whereby a natural air convection is circulated through the front shell 11 and the rear shell 12 of the lamp housing 10. Thus, the heat of the LEDs 212 of the light sources 21 is continuously and effectively removed.

Figure 4:
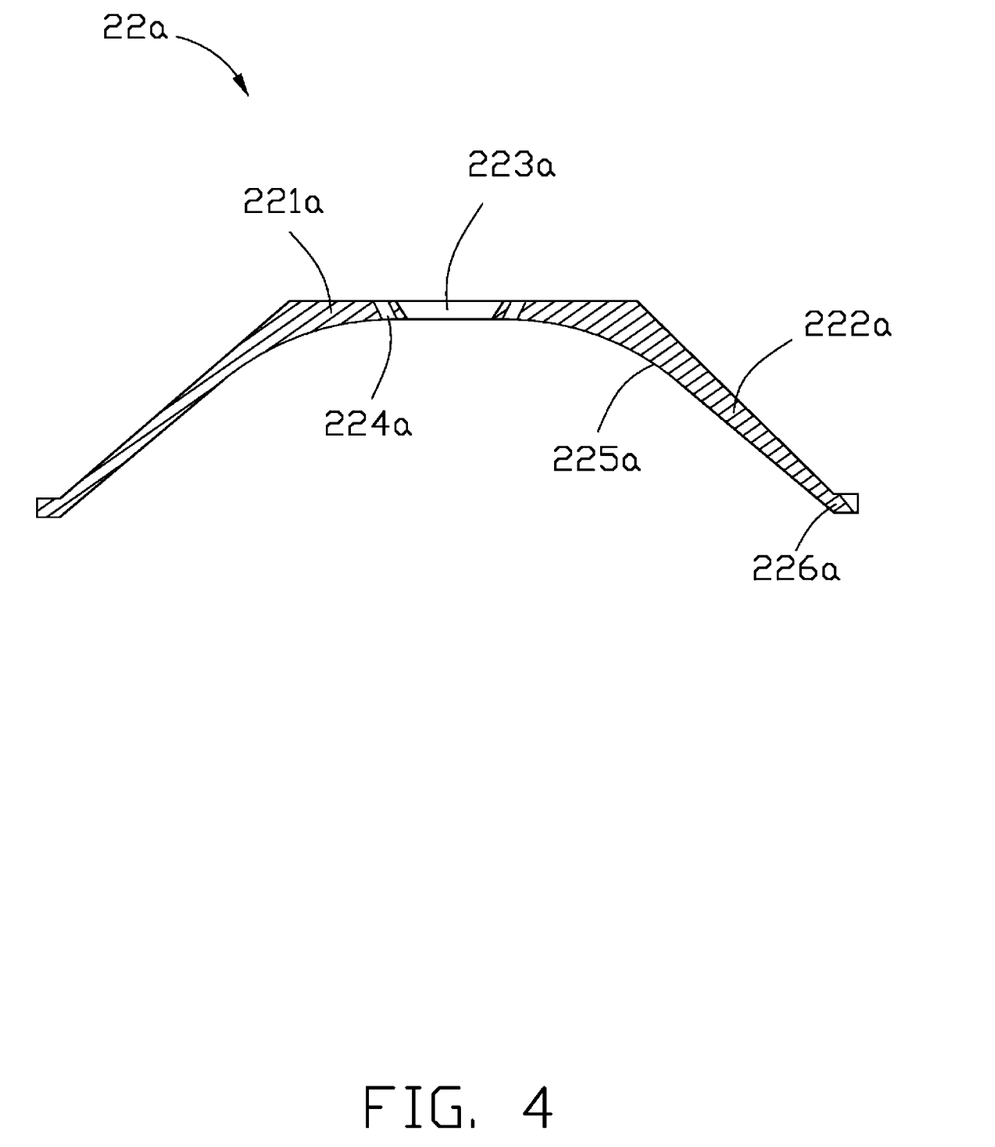
FIG. 4 shows an alternative light reflector.

In the LED lamp 100, the light reflecting surface 225 of the light reflector 22 has a shape meeting the arrangement of light sources 21 mounted on the mounting seat 34. Alternatively, the light reflecting surface 225 of the light reflector 22 can have other shapes. FIG. 4 shows an alternative light reflector 22a which includes a mounting portion 221a and a tapered reflecting portion 222a extending forwardly and outwardly from an outer peripheral edge of the mounting portion 221a. The mounting portion 221a defines a positioning hole 223a therein for the heat conducting member 33 extending therethrough. A plurality of wire holes 224a are defined in the mounting portion 221a of the light reflector 22a and located around the positioning hole 223a. The light reflector 22a forms a light reflecting surface 225a at a front side thereof facing the light sources 21. The light reflecting surface 225a is a continuous, smooth curved surface, and gradually expands outwardly from the outer peripheral edge of the mounting portion 221a towards a front free end 226a of the reflecting portion 222a.

Figure 5:
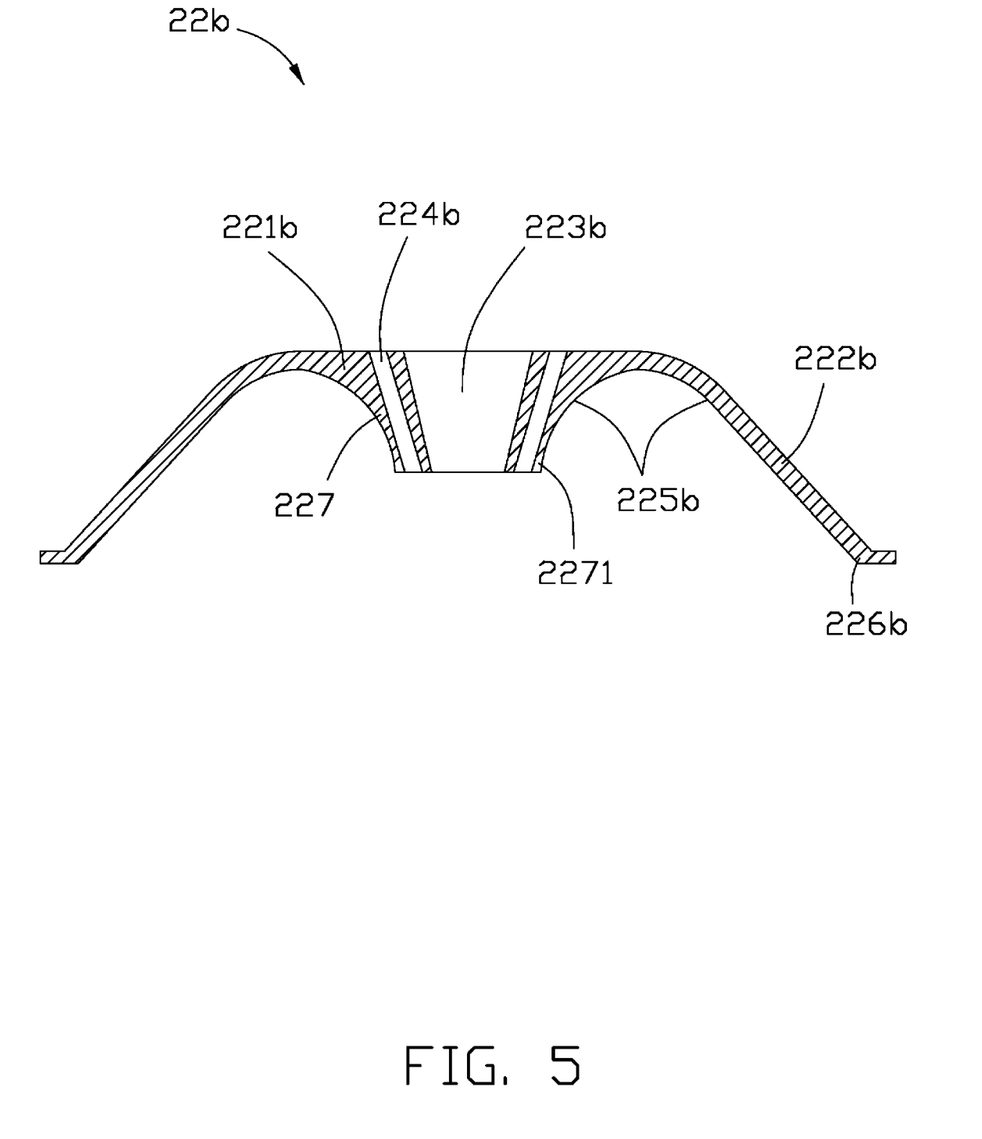
FIG. 5 shows a further alternative light reflector.

FIG. 5 shows a further alternative light reflector 22b which includes a mounting portion 221b and a tapered reflecting portion 222b extending forwardly and outwardly from an outer peripheral edge of the mounting portion 221b. The mounting portion 221b defines a positioning hole 223b therein for the heat conducting member 33 extending therethrough A plurality of wire holes 224b are defines in the mounting portion 221b of the light reflector 22b and located around positioning hole 223b. The mounting portion 221b forms an annular protrusion 227 on an inner peripheral edge thereof. The annular protrusion 227 extends forwardly from the inner peripheral edge of the mounting portion 221b towards the optical lens 23. The light reflector 22b forms a light reflecting surface 225b at a front side thereof facing the light sources 21. The light reflecting surface 225b is a concave surface, and gradually expands outwardly from a free end 2271 of the annular protrusion 227 to the outer peripheral edge of the mounting portion 221b, and then expands outwardly from the outer peripheral edge of the mounting portion 221b to a front free end 226b of the reflecting portion 222b.

In the LED lamp 100, the mounting seat 34 is in the form of a frustum of a triangular pyramid, and the light sources 21 are mounted on the three sloping heat absorbing surfaces 343 of the mounting seat 34. Alternatively, the mounting seat 34 can have other shapes, such as a frustum of a square pyramid, a frustum of a pentagonal pyramid.

Figure 6:
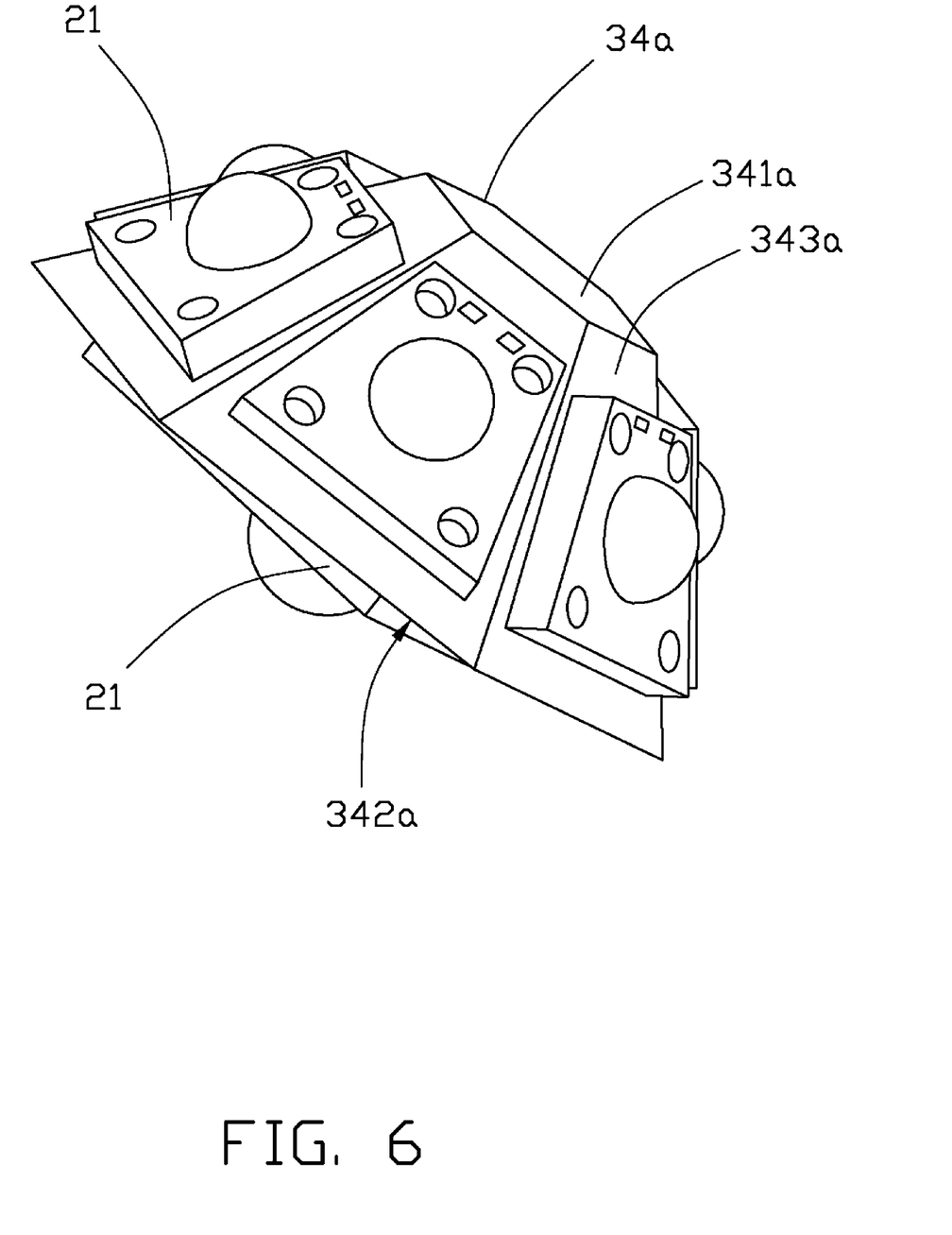
FIG. 6 is an assembled, isometric view of a plurality of light sources and an alternative mounting seat.

FIG. 6 shows a plurality of light sources 21 and an alternative mounting seat 34a. In the present embodiment, the mounting seat 34a is in the form of a frustum of a hexagonal pyramid. The mounting seat 34 includes a hexagonal top surface 341a connected to the heat conducting member 33, an opposite hexagonal bottom surface 342a parallel to the top surface 341a, and six sloping heat absorbing surfaces 343a between the top surface 341a and the bottom surface 342a.

Each of the heat absorbing surfaces 343a of the mounting seat 34a is attached with a light source 21. The light emitted by the light sources 21 which are respectively mounted on the sloping heat absorbing surfaces 343a is reflected and guided by the light reflector 22 towards an outside object. The bottom surface 342a of the mounting seat 34a is further attached with a light source 21 to increase a brightness of the LED lamp.

Figure 7:
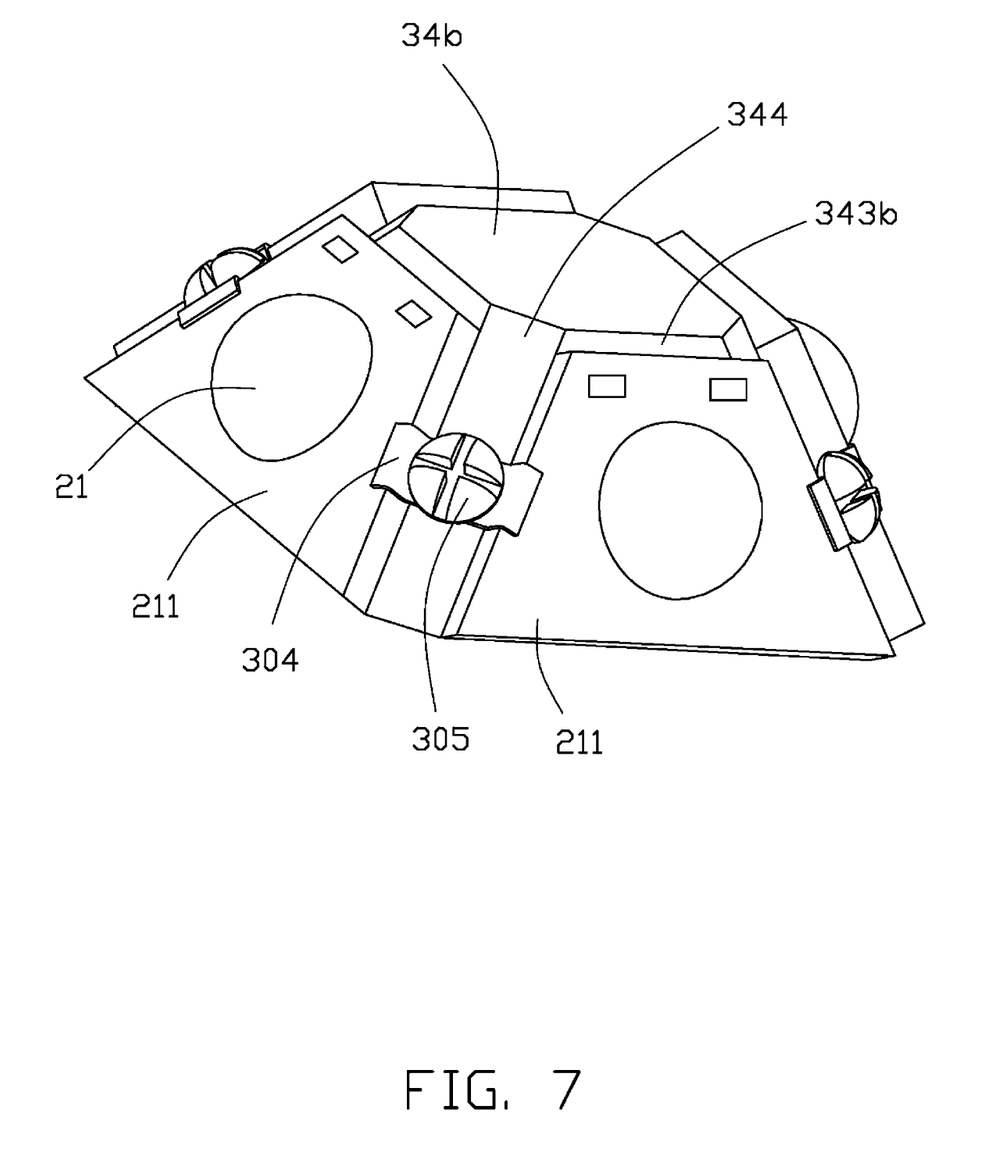
FIG. 7 is an assembled, isometric view of a plurality of light sources and a further alternative mounting seat.

FIG. 7 shows a plurality of light sources 21 and a further alternative mounting seat 34b. In the present embodiment, the mounting seat 34b is in the form of a frustum of a square pyramid. The mounting seat 34b has four sloping heat absorbing surfaces 343b for mounting the light sources 21 thereon. The mounting seat 34b further forms a narrow sloping fixing surface 344 between every two heat absorbing surfaces 343b. The light sources 21 are securely attached to the heat absorbing surfaces 343b via a plurality of fixing devices. Each fixing device includes a fixing plate 304 and a screw 305 inserted in the fixing plate 304. In assembly, the screw 305 of each fixing device threadedly engages into a corresponding fixing surface 344 of the mounting seat 34b, with two opposite ends of the fixing plate 304 firmly abutting the substrates 211 of two adjacent light sources 21, respectively. Each light source 21 is securely attached to a corresponding heat absorbing surface 343b of the mounting seat 34b via the fixing plates 304 of two fixing devices located at two opposite sides of the light source 21. Comparing with the fixing manner shown in FIGS. 2 and 6, the fixing manner of the present embodiment needs fewer fixing devices, whereby the fixing process of the light sources 21 is simplified and convenient. A head of the screw 305 of each fixing device is received in a recess defined between the substrates 211 of two adjacent light sources 21, to thereby prevent the screw 305 from blocking and disturbing light emitted by the light sources 21. In addition, in this embodiment, there is no necessity to define holes in the substrates of the light sources 21 for receiving the screws 305, which can simplify the layouts of circuits in the substrates and enable each of the substrates to have a better integrity and strength.

Figure 8:
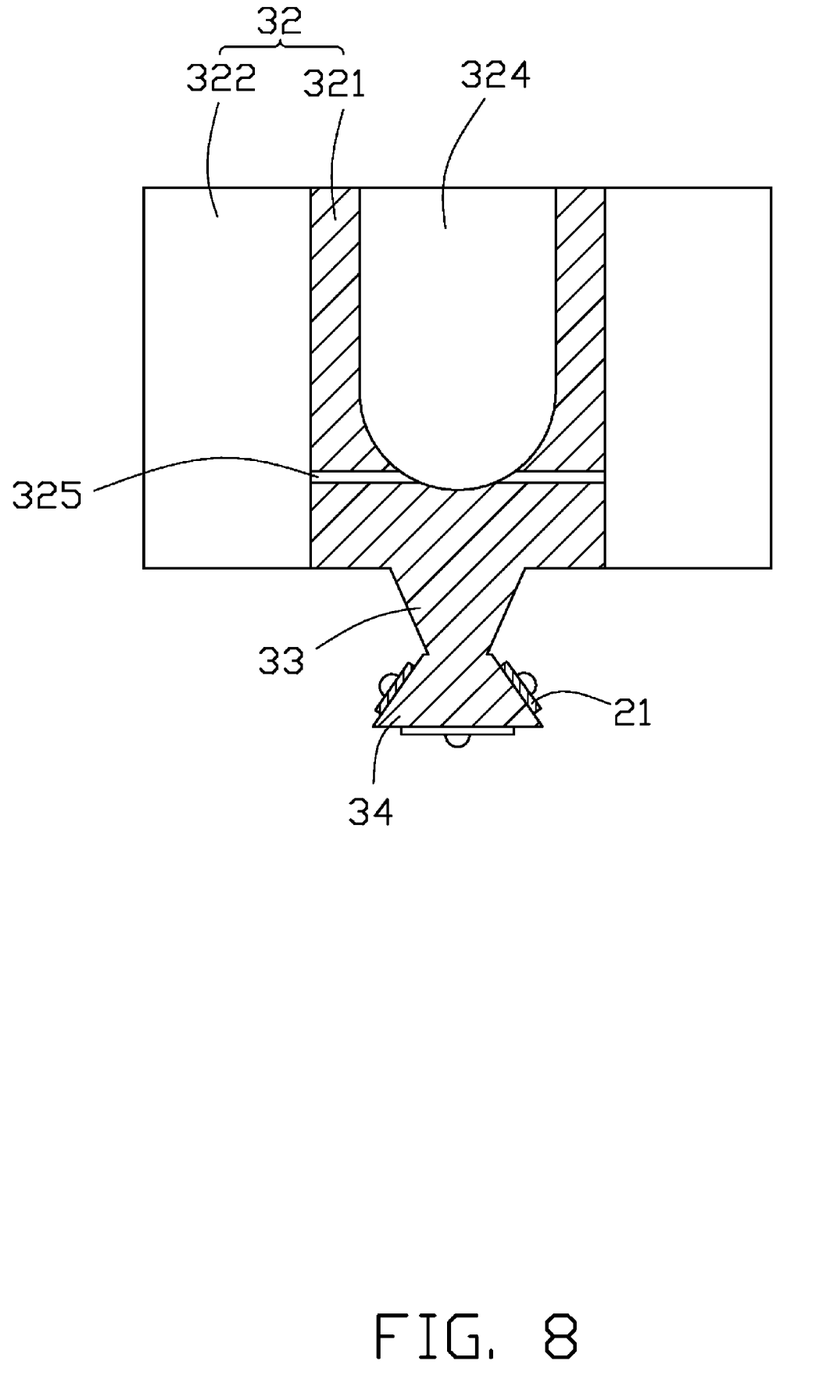
FIG. 8 is an assembled, isometric view of a light engine of an LED lamp in accordance with a second embodiment.

Referring to FIG. 8, a light engine of an LED lamp according to a second embodiment is illustrated. The light engine is cooperatively formed by the heat sink 32, the heat conducting member 33 and the mounting seat 34. Except the following differences, the light engine of the present embodiment is essentially the same as the light engine of the LED lamp 100 shown in FIG. 1. In the present embodiment, a blind hole 324 is axially defined in a rear portion of the solid base 321 in order to increase the heat exchange surface of the heat sink 32. The blind hole 324 extends vertically from the rear portion of the solid base 321 adjacent to the electrical part 40 toward a front portion of the solid base 321 adjacent to the optical part 20.

A plurality of air venting holes 325 are radially defined in the front portion of the solid base 321. The air venting holes 325 communicate a bottom of the blind hole 324 with an outside of the solid base 321. In operation, air in the blind hole 324 is heated by the heat of the LEDs 212 of the light sources 21 transferred to the heat sink 32 and floats upwardly. The heated, upwardly floating air enters into the rear shell 12 via the air openings 421 of the partition plate 42, and then escapes to the ambient atmosphere via the air apertures 123 of the rear shell 12. Cooling air in the ambient atmosphere enters into the blind hole 324 via the air venting holes 325 defined in the solid base 321, whereby an additional natural air convection is circulated through the heat sink 32 to further increase the heat dissipation efficiency of the light engine.

Figure 9:
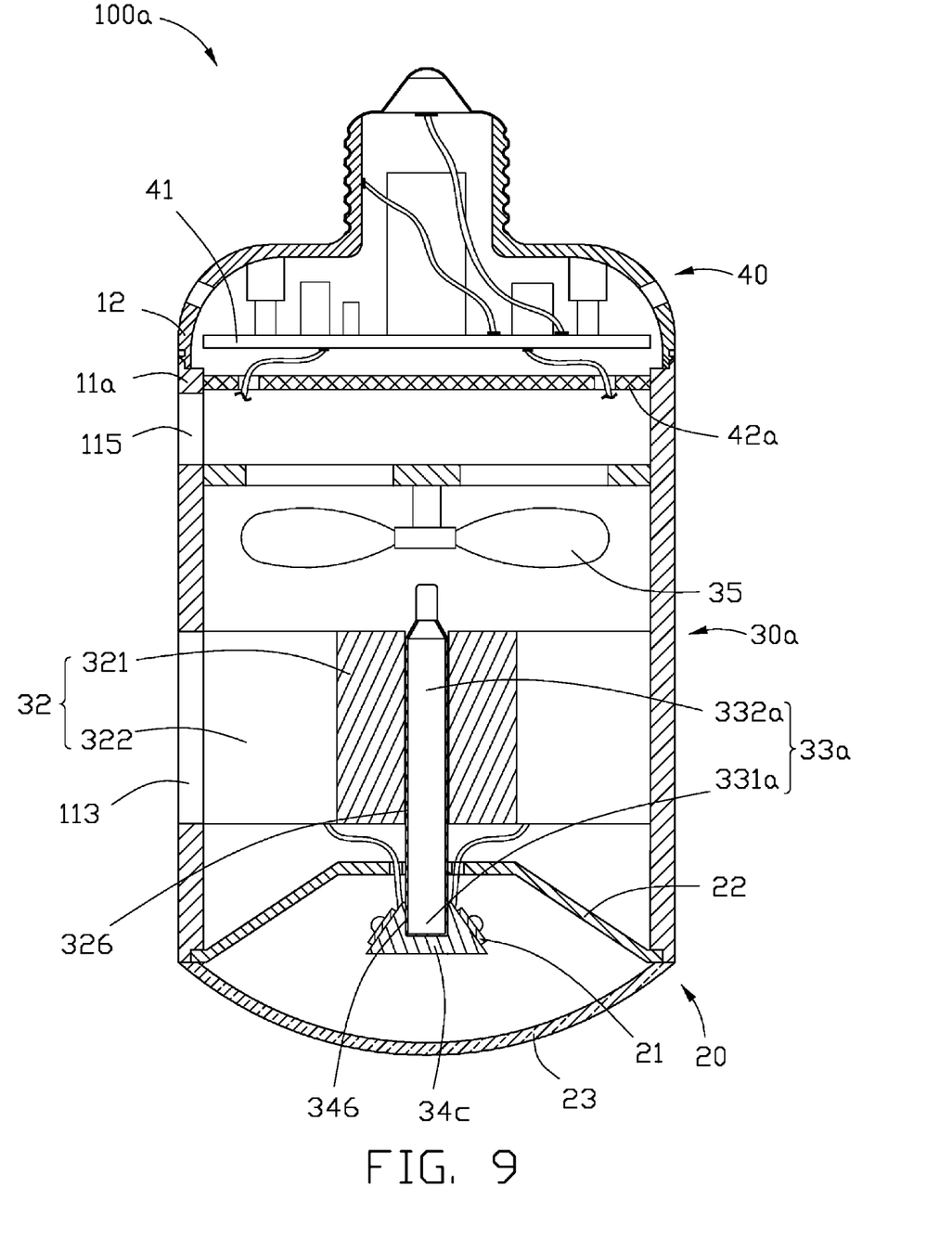
FIG. 9 is a cross-sectional view of an LED lamp in accordance with a third embodiment.
Figure 10:
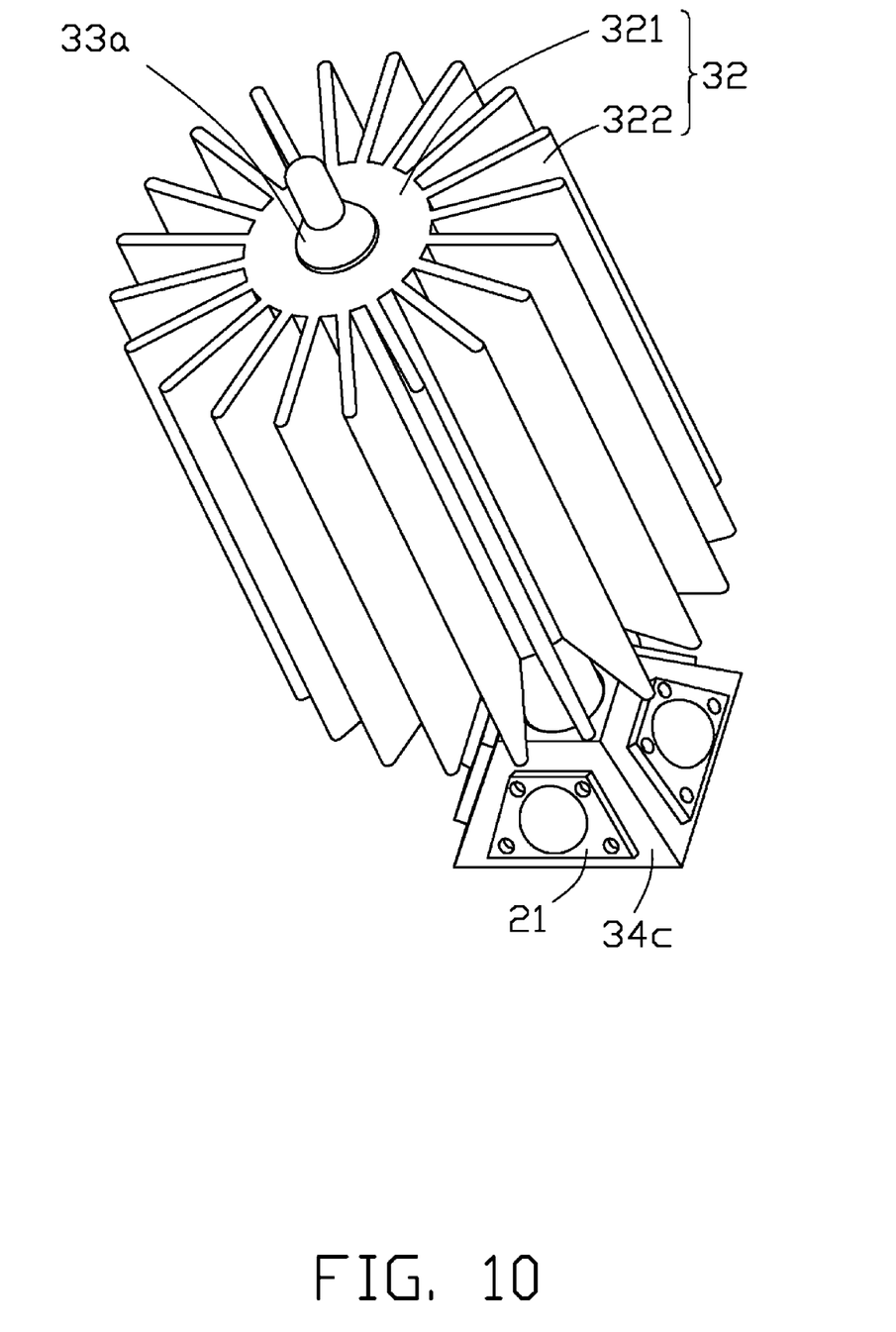
FIG. 10 is an assembled, isometric view of a light engine of the LED lamp of FIG. 9.

Referring to FIGS. 9-10, an LED lamp 100a according to a third embodiment is illustrated. The difference between the present LED lamp 100a and the LED lamp 100 illustrated in FIG. 1 lies in the heat dissipation part 30a. In the present embodiment, the heat dissipation part 30a further includes a cooling fan 35 provided between the electrical part 40 and the heat sink 32, and a heat conducting member of the heat dissipation part 30a is a heat pipe 33a. It is well known in the art that a heat pipe is a sealed hollow pipe body receiving working fluid therein and containing a wick structure disposed on an inner wall of the pipe body.

The heat pipe 33a transfers heat under phase change of working fluid hermetically contained therein. The heat pipe 33a is linear-shaped, and includes a front evaporating section 331a connecting with the mounting seat 34c and a rear condensing section 332a connecting with the heat sink 32. The heat sink 32 defines axially a first receiving hole 326 in the solid base 321 thereof. The condensing section 332a of the heat pipe 33a is received in the first receiving hole 326 of the heat sink 32. The mounting seat 34c defines axially a second receiving hole 346 therein. The evaporating section 331a is received in the second receiving hole 346 of the mounting seat 34c. At the free end of the evaporating section 331a forms a planar surface lining with an inner wick structure thereon to eliminate the ineffective end section commonly defined in the conventional heat pipe. Thus, enhances the effective heat contacting area between the mounting seat 34c and the evaporating section 331a of the heat pipe 33a.

The cooling fan 35 is located at a rear side of the heat sink 32. The front shell 11 defines radially a plurality of air openings 115 in a rear end thereof adjacent to the rear shell 12. The air openings 115 of the front shell 11 function as air supply passage openings or air exhausting passage openings for the cooling fan 35. The partition plate 42a does not define air openings therein, to thereby isolate the circuit board 41 from the heat dissipation part 30a. When the cooling fan 35 operates, the cooling fan 35 inhales air from the ambient atmosphere via the air openings 115 defined in the rear end of the front shell 11. An airflow generated by the cooling fan 35 flows towards the heat sink 32, and then is exhausted out of the front shell 11 via the air exchanging holes 113 of the front shell 11 located corresponding to the fins 322 of the heat sink 32, whereby a forced air convection is circulated through the front shell 11 to further increase the heat dissipation efficiency of the LED lamp 100.

Figure 11:
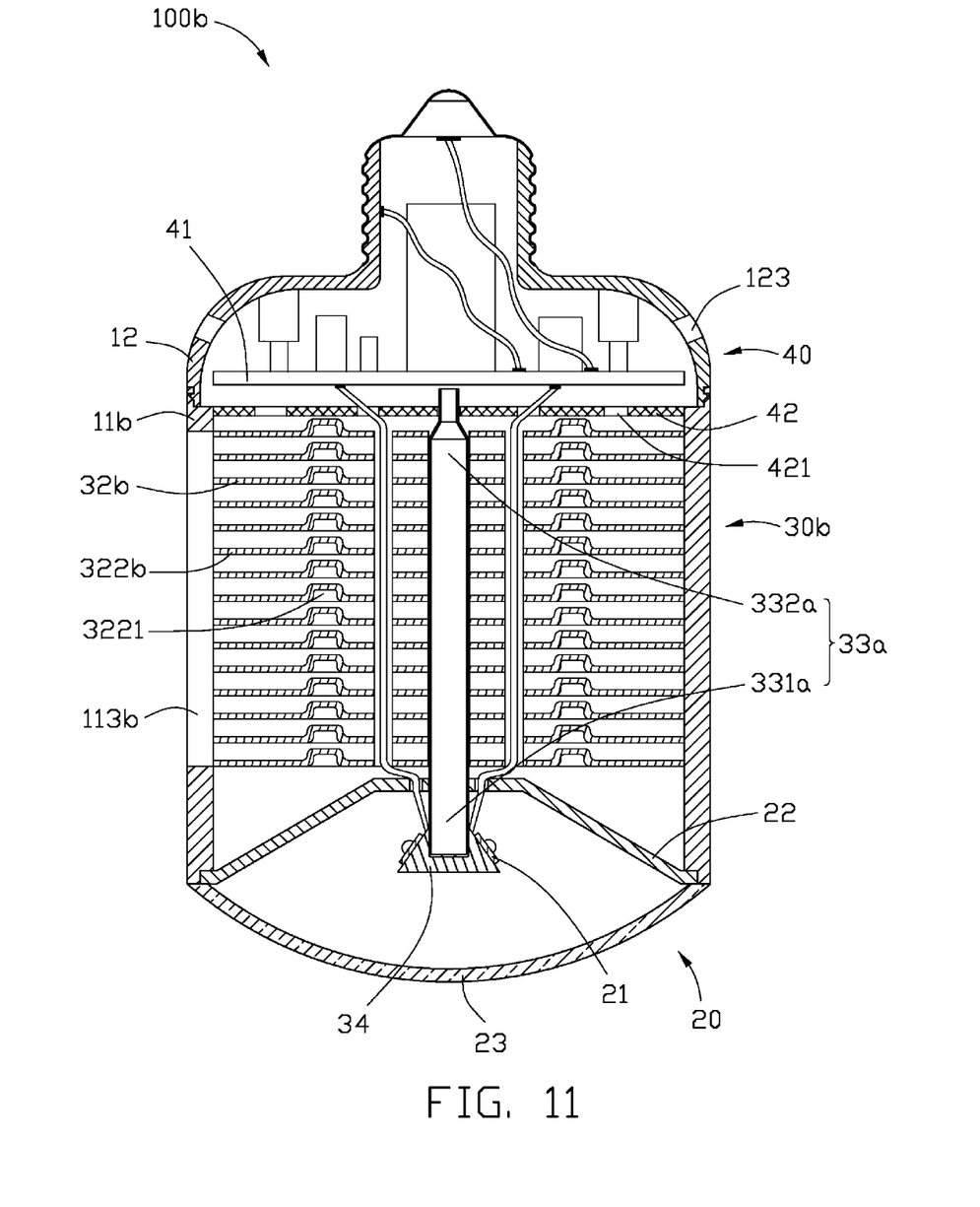
FIG. 11 is a cross-sectional view of an LED lamp in accordance with a fourth embodiment.

Referring to FIG. 11, an LED lamp 100b according to a fourth embodiment is illustrated. The LED lamp 100b also utilizes the heat pipe 33a to transfer heat from the mounting seat 34 to a heat sink 32b thereof. The difference between the present LED lamp 100b and the LED lamp 100a illustrated in FIG. 9 lies in the heat dissipation part 30b. In the present embodiment, the heat sink 32b of the heat dissipation part 30b includes a plurality of parallel plate fins 322b stacked together along an axial direction of the condensing section 332a of the heat pipe 33a. The front shell 11b defines a plurality of air exchanging holes 113b therein corresponding to the fins 322b of the heat sink 32b. The evaporating section 331a of the heat pipe 33a is inserted in the mounting seat 34, while the condensing section 332a of the heat pipe 33a is inserted in the fins 322b of the heat sink 32. Each of the fins 322b forms a plurality of protruding members (not labeled) protruding towards an adjacent rear fin 322b. Each of the protruding members defines a vent 3221 therein. The vent 3221 communicates with two opposite sides of the fin 322b. Thus, when air between adjacent fins 322b is heated by heat transferred from the light sources 21 through the heat pipe 33a, the heated air rises upwardly through the vent 3221, and then through air openings 421 defined in the partition plate 42 into the electrical part 40, and finally to the ambient atmosphere through the air apertures 123 defined in the rear shell 12. Cooling air in the ambient atmosphere enters into the front shell 11b via the air exchanging holes 113b of the front shell 11b, whereby a nature air convection is circulated through the front shell 11b and the rear shell 12.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED lamp, comprising:
   a hollow lamp housing;
   an optical part located at a front end of the lamp housing, the optical part comprising a plurality of light sources each being provided with at least one LED, a light reflector and an optical lens;
   an electrical part located at a rear end of lamp housing, the electrical part being provided with a circuit board electrically connecting with the light sources; and
   a heat dissipation part located between the optical part and the electrical part, the heat dissipation part comprising:
      a heat sink arranged in the lamp housing and comprising a plurality of fins, the lamp housing defining a plurality of air exchanging holes therein corresponding to the fins of the heat sink;
      a mounting seat located between the heat sink and the optical part, the mounting seat comprising a top surface facing the heat sink, an opposite bottom surface, and a plurality of sloping heat absorbing surfaces between the top surface and the bottom surface, the heat absorbing surfaces facing the heat sink and the light sources being respectively arranged on and thermally connected with the heat absorbing surfaces, heat generated by the light sources being absorbed by the mounting seat; and
      a heat conducting member connecting the mounting seat with the heat sink to transfer heat from the mounting seat to the fins of the heat sink, the light reflector of the optical part being located between the heat sink and the mounting seat and surrounding the heat conducting member, the light reflector forming a light reflecting surface at a front side thereof facing the light sources, the optical lens being located in front of the light reflector and the mounting seat, the light reflector and the optical lens cooperatively receiving the mounting seat and the light sources therein, light emitted by the light sources being reflected and guided by the light reflector to an outside through the optical lens.

2. The LED lamp of claim 1, wherein the mounting seat is in the form of a frustum of a pyramid, a cross-sectional area of the mounting seat being gradually decreased from the bottom surface towards the top surface of the mounting seat, each of the heat absorbing surfaces extending from the bottom surface to the top surface and converging towards a center of the top surface of the mounting seat.

3. The LED lamp of claim 1, wherein the light reflector comprises a planar mounting portion and a tapered reflecting portion extending forwardly and outwardly from an outer peripheral edge of the mounting portion towards the optical lens, the mounting portion defining a positioning hole therein for the heat conducting member extending therethrough.

4. The LED lamp of claim 3, wherein the light reflecting surface of the light reflector comprises an annular planar surface formed on the mounting portion and a tapered surface formed on the reflecting portion, the tapered surface gradually expanding outwardly from the outer peripheral edge of the mounting portion to a front free end of the reflecting portion located adjacent to the optical lens.

5. The LED lamp of claim 3, wherein the light reflecting surface of the light reflector is a continuous, smooth curved surface, and gradually expands outwardly from the outer peripheral edge of the mounting portion to a front free end of the reflecting portion located adjacent to the optical lens.

6. The LED lamp of claim 3, wherein the mounting portion forms an annular protrusion on an inner peripheral edge thereof, the annular protrusion extends forwardly from the inner peripheral edge of the mounting portion towards the optical lens, the light reflecting surface of the light reflector being a concave surface, and gradually expanding outwardly from a free end of the annular protrusion to the outer peripheral edge of the mounting portion, and then expanding outwardly from the outer peripheral edge of the mounting portion to a front free end of the reflecting portion located adjacent to the optical lens.

7. The LED lamp of claim 1, wherein the heat sink further comprises a solid base, the fins of the heat sink extending radially and outwardly from a circumferential surface of the solid base, the heat conducting member being connected to the solid base of the heat sink.

8. The LED lamp of claim 7, wherein the heat conducting member is solid and has a rear large end connected to the solid base of the heat sink and an opposite front small end connected to the mounting seat, a cross-sectional area of the heat conducting member being gradually decreased from the large end towards the small end of the heat conducting member.

9. The LED lamp of claim 7, wherein a blind hole is axially defined at a rear portion of the solid base adjacent to the electrical part, the blind hole extending from the rear portion of the solid base towards a front portion of the solid base, a plurality of air venting holes being radially defined in the front portion of the solid base, the air venting holes communicating a bottom of the blind hole with an outside of the solid base.

10. The LED lamp of claim 7, wherein the heat conducting member is a heat pipe, the heat pipe comprising a front evaporating section inserted in the mounting seat and a rear condensing section inserted in the solid base of the heat sink.

11. The LED lamp of claim 1, wherein the heat dissipation part further comprises a cooling fan provided between the electrical part and the heat sink, the lamp housing further defining radially a plurality of air openings in a rear end thereof adjacent to the electrical part, the air openings functioning as air passage openings for the cooling fan.

12. The LED lamp of claim 1, wherein the heat conducting member is a heat pipe, the heat pipe comprising a front evaporating section and a rear condensing section, the fins of the heat sink being plate-shaped and parallel to each other, the fins being stacked together along an axial direction of the condensing section of the heat pipe, the evaporating section of the heat pipe being inserted in the mounting seat and the condensing section of the heat pipe being inserted in the fins of the heat sink.

13. The LED lamp of claim 1, wherein each of the fins forms a plurality of protruding members protruding towards an adjacent rear fin, each of the protruding members defining a vent therein, the vent communicating with two opposite sides of the fin.

14. The LED lamp of claim 1, wherein the lamp housing comprises a front shell and a rear shell connected to a rear end of the front shell, the optical part being arranged in the front end of the front shell, the heat dissipation part being arranged in the front shell, the electrical part being arranged in the rear shell.

15. The LED lamp of claim 14, wherein the front shell is a hollow cylinder and the rear shell is cup-shaped, a plurality of air apertures being defined radially through the rear shell for airflow flowing into and out of the rear shell.

16. The LED lamp of claim 1, wherein the light sources are securely attached to the heat absorbing surfaces via a plurality of fixing devices, each of the fixing devices comprises a fixing plate and a screw inserted in the fixing plate, the mounting seat forming a narrow sloping fixing surface between every two heat absorbing surfaces, the screw of each of the fixing devices threadedly engaging into the fixing surface of the mounting seat, with two opposite ends of the fixing plate firmly abutting edges of two adjacent light sources, respectively.

17. The LED lamp of claim 1, wherein the optical part further comprises a light source attached on the bottom surface of the mounting seat.

* * * * *